Oct. 23, 1962 R. A. BRANDYS 3,059,604

APPARATUS FOR SOLDERING

Filed Oct. 9, 1958 4 Sheets-Sheet 1

Inventor:
Roman A. Brandys
By Robert F. Wietzel, Atty.

Oct. 23, 1962 R. A. BRANDYS 3,059,604
APPARATUS FOR SOLDERING
Filed Oct. 9, 1958 4 Sheets-Sheet 2
FIG. 2.
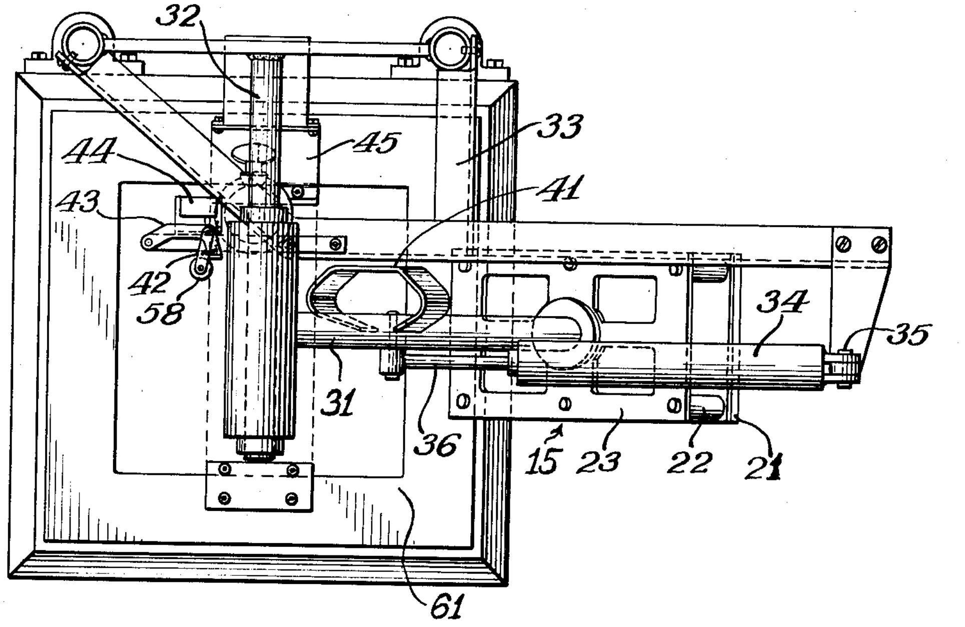
FIG. 3.
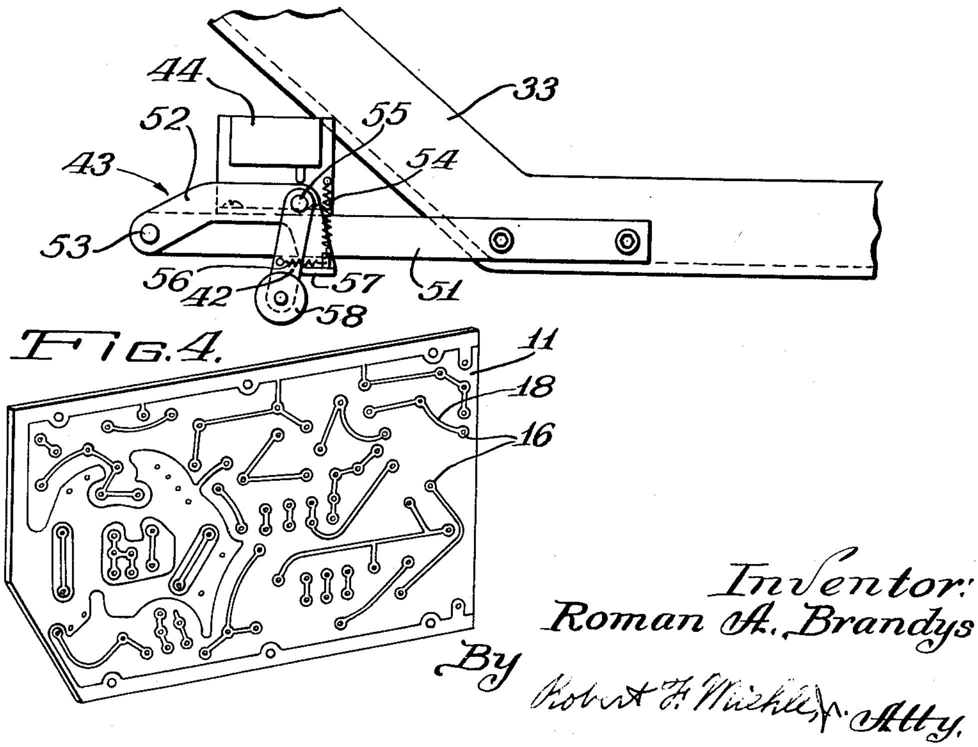
FIG. 4.
Inventor:
Roman A. Brandys
By Robert F. Wickle[?], Atty.

Inventor:
Roman A. Brandys
By Robert F. Wiehle, Jr. Atty.

Oct. 23, 1962 R. A. BRANDYS 3,059,604

APPARATUS FOR SOLDERING

Filed Oct. 9, 1958 4 Sheets-Sheet 4

Inventor:
Roman A. Brandys
By Robert F. Miehle, Jr. Atty.

United States Patent Office 3,059,604

Patented Oct. 23, 1962

3,059,604

APPARATUS FOR SOLDERING

Roman A. Brandys, Chicago, Ill., assignor to Bell & Howell Company, Chicago, Ill., a corporation of Illinois Filed Oct. 9, 1958, Ser. No. 766,214

3 Claims. (Cl. 113—126)

This invention relates to apparatus for soldering, and more particularly to an apparatus for dip-soldering printed circuits.

To solder terminal wires of components mounted on printed circuit boards to the printed circuits, it has been customary to use dip-soldering techniques in which the wires project down through holes in the boards and solder is applied to the bottom of the boards to form electro-conductive connections between the wires and printed circuits on the bottoms of the boards. It would be desirable to apply the molten solder to each portion of the board for only a limited time and to have the upper surface free of dross when the printed circuit board comes in contact therewith.

An object of the invention is to provide a new and improved apparatus for dip-soldering articles.

Another object of the invention is to provide apparatus for dip-soldering in which one or both adjacent portions of a printed circuit board and a molten solder bath is bowed toward the other to apply solder to only the adjacent portion of the printed circuit board.

A further object of the invention is to provide an apparatus in which a standing wave of molten solder is created above the upper surface of a solder bath and a printed circuit board is bowed convex to the upper surface of the bath and swung through the wave to apply solder to the lower surface of the board.

A complete understanding of the invention may be obtained from the following detailed description of a dip-soldering apparatus forming a specific embodiment thereof, when read in conjunction with the appended drawings, in which:

FIG. 2 is a fragmentary top plan view of the apparatus shown in FIG. 1;

FIG. 3 is an enlarged, fragmentary, top plan view of the apparatus;

FIG. 4 is a perspective view of a printed circuit board dip-soldered by the apparatus shown in FIG. 1;

Figure 1:
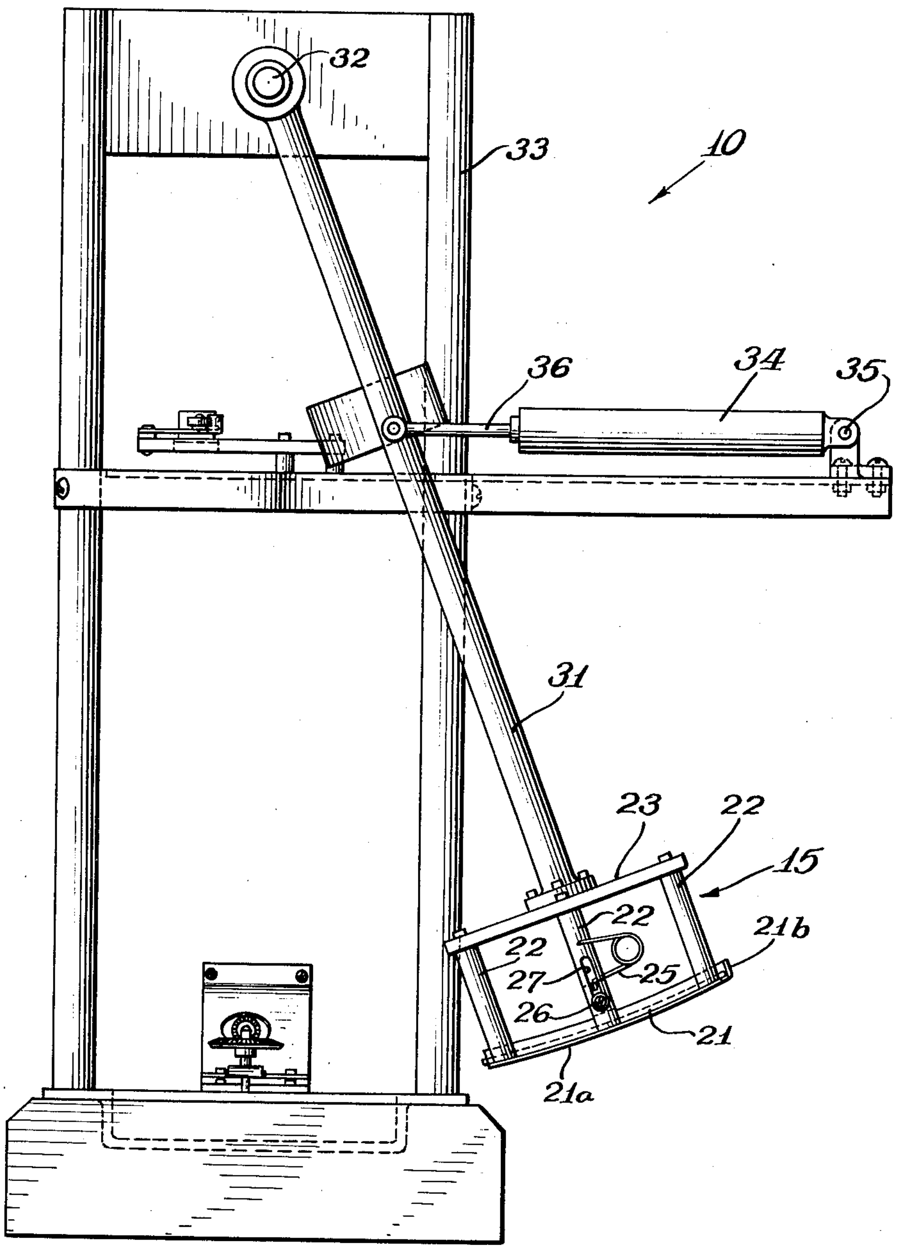
FIG. 1 is a front elevational view of an apparatus forming one embodiment of the invention.

The invention provides apparatus for dip-soldering terminal wires of electrical components to printed circuitry of a printed circuit board. The apparatus may include a carrier for holding a printed circuit board in a bowed condition and swinging the board across a wave of solder pumped up above the normal level of a solder bath by a gear pump in the bath so that, in effect, each portion of the bottom of the board is wiped through the wave.

Referring now in detail to the drawings, a soldering fixture 10 is adapted to wipe the bottom of a flexible printed circuit board 11 (FIG. 4), which has previously been prepared for soldering, through a standing wave 12 of solder (FIG. 8) pumped by a pump 9 above the normal level 13 of a solder bath 14. For best results, the solder substantially fills a pot 61. A carrier 15 bows the board 11, and swings it against and past the wave 12, and the wave solders terminal wires 16 of electrical components 17 to printed circuitry 18 (FIG. 4) of the board. The components 17 may be of any type, such as, for example, tube sockets, resistors, transistors and capacitors.

The carrier 15 includes a U-shaped combined guide and support 21 including bowed side rails *21a* and an end stop *21b* to position the board 11. Posts or columns 22 support the guide 21 from a rigid upper plate 23, and manually releasable clamps 24 press the central portions of the board 11 downwardly to bow the board downwardly and fit it against flanges *21c* and *21d* of the side and end members *21a* and *21b*, respectively. Torsion springs 25 mounted on intermediate posts 22 urge the clamps 24 downwardly, and the clamps are secured slidably on the intermediate posts by bolts 26 projecting through slots 27 extending generally vertically.

The plate 23 is rescured rigidly to a tubular arm 31 mounted pivotally on a horizontally extending arbor 32 of a rigid vertical frame 33. The longitudinal axis of the arbor 32 is the center of curvature of the flanges *21c* of the guide *21a*. A hydraulic motor cylinder 34 of a known type is secured pivotally by a pin 35 to the frame 33 and a piston 36 is connected pivotally to the arm 31. The motor urges the arm 31 in a counter-clockwise direction, as viewed in FIG. 1, to normally position the carrier 15 in its righthand position which is its unloading or rest position. The arm 31 may be swung manually against the action of the cylinder 34 and piston 36 to a loading position in which the carrier 15 is approximately as far to the left of the fixture as the carrier is to the right of the fixture when in its unloading position. Then when the operator releases the arm 31, the cylinder 34 and piston 36 swing the carrier 15 counter-clockwise to its unloading position.

Figure 7:
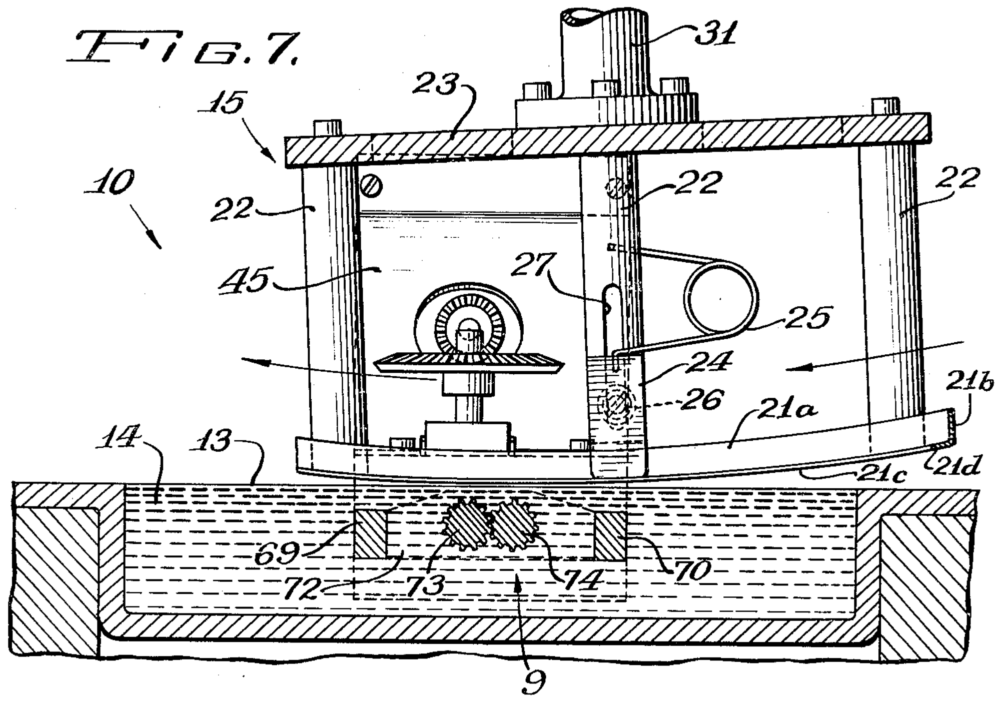
FIG. 7 is an enlarged, fragmentary, vertical section of the apparatus during one stage of the operation.
Figure 8:
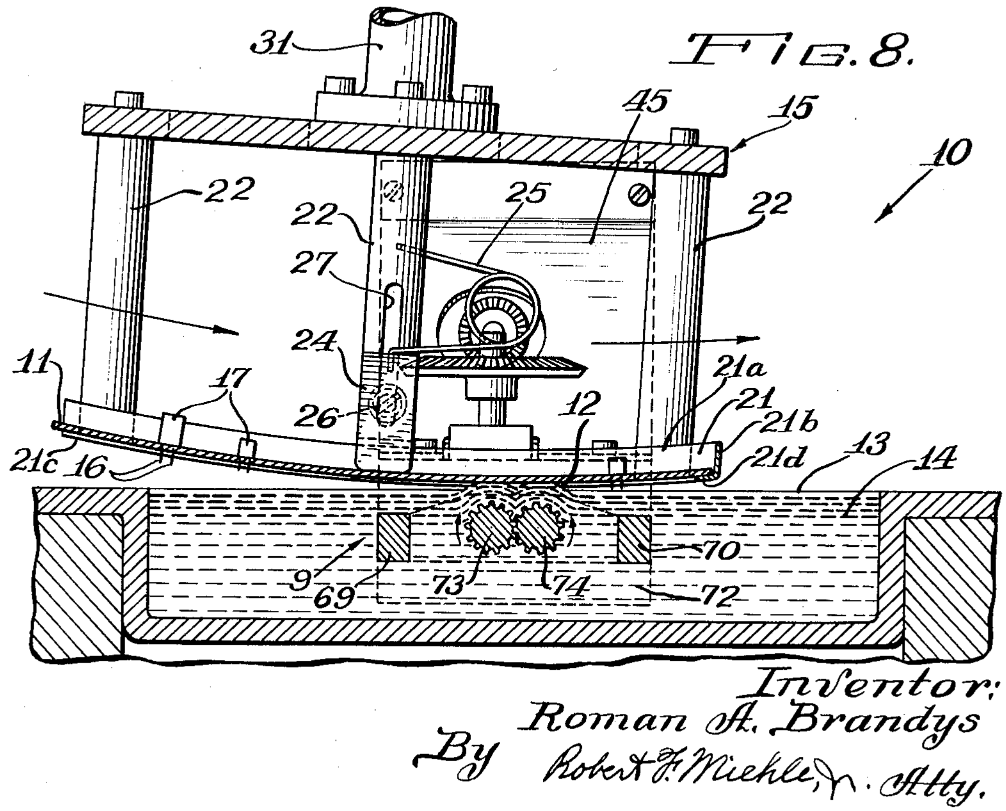
FIG. 8 is a view similar to FIG. 7 during a subsequent stage of operation.

When the carrier 15 is swung to the left as shown in FIG. 7, the carrier is just above the level 13 of the solder bath 14 and out of contact with the solder. The board 11 then is slid manually into the carrier and under the clamps 24, which bow the board 11 against the flanges *21c* and *21d* so that the board is curved along an arc centered on the arbor 32 (FIG. 1). The arm 31 and holder or carrier 15 are released, and the motor comprised of the cylinder 34 and piston 36 swings the carrier back to the right at a uniform rate of speed. Just before the righthand end of the board 15 reaches its lowest point of travel, a tripping cam 41 (FIG. 2) engages an arm 42 of a one-way or ratchet type operating mechanism 43 and closes switch 44 to start a motor 45 to drive the pump 9 (FIG. 8). The pump then pumps the molten solder 14 in the form of the wave 12, and then the carrier moves the bottom of the board 11 incrementally against and through the upper portion of the wave. The hot solder applied to the wires 16 and circuitry 18 forms solder connections therebetween. The solder pumped up into the wave causes the surface of the wave to be free of any dross so that the board 11 is contacted only by clean liquid solder.

Just after the lefthand end of the board 11, as viewed in FIG. 8, is moved out of contact with the wave 12, the cam 41 releases the arm 42 and the switch 44 opens to stop the motor 45. The switch-operating mechanism 43 and switch 44 are mounted on the frame by a rigid bracket 51 (FIG. 3). The mechanism 43 has an arm 52 pivoted on a pin 53 and urged lightly toward the switch 44 by spring 54. The arm 42 is mounted pivotally on the arm 52 by a pin 55. The arm 42 is urged in a counter-clockwise direction by a spring 56 to a position engaging a stop 57 of arm 52. The arm 42 carries a roller 58. When the cam 41 is moved to the left past the mechanism 43, the cam engages the roller and pushes the arm 42 in a clockwise direction and the switch 44 is not actuated. However, when the cam is swung to the right on its return stroke, it engages the roller 58 and swings both the arms 42 and 52 counter-clockwise and the arm 52 actuates the switch 44.

Figure 5:
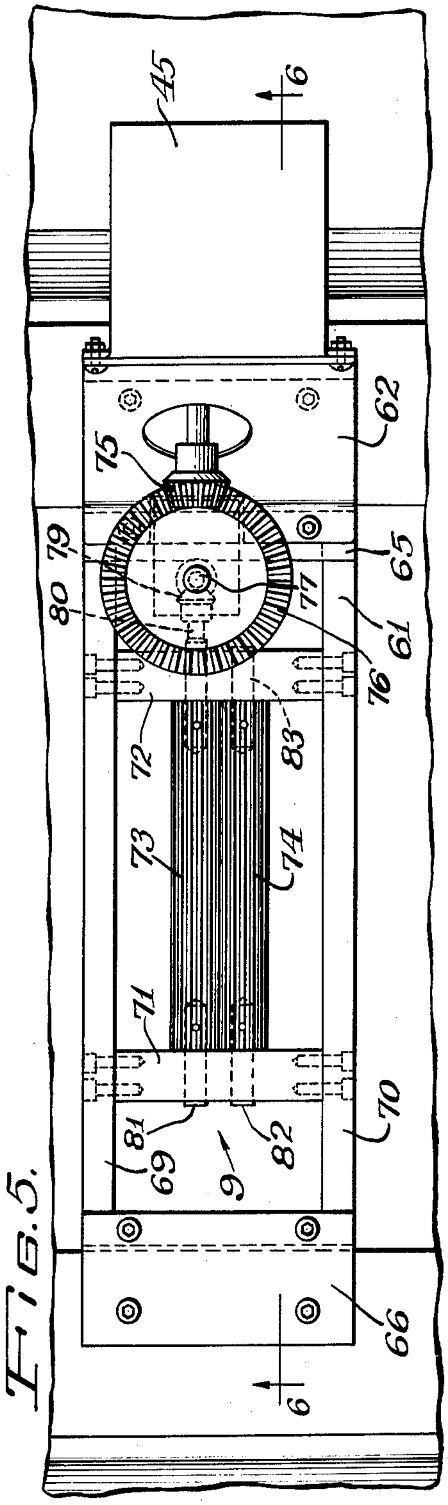
FIG. 5 is an enlarged, fragmentary, top plan view of a gear pump of the apparatus shown in FIG. 1.
Figure 6:
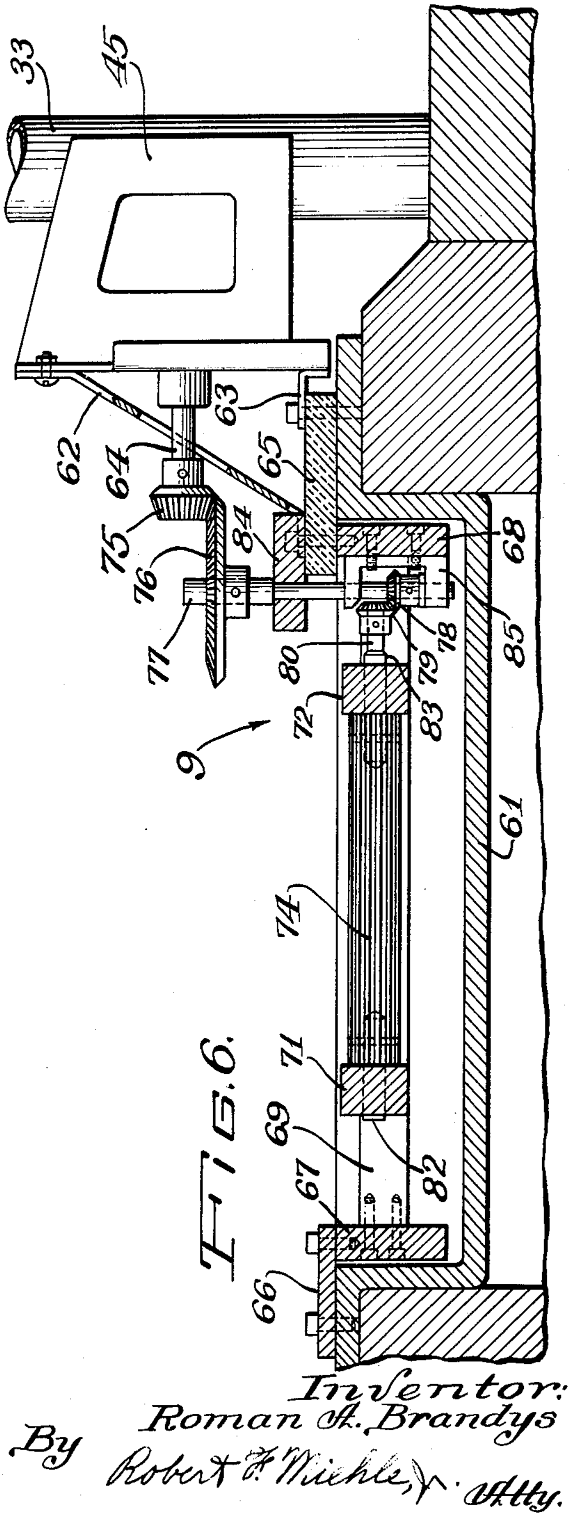
FIG. 6 is a fragmentary, vertical section taken along line 6—6 of FIG. 5.

As best shown in FIGS. 5 and 6, the gear pump 9 includes the motor 45 which is mounted rigidly on heated solder pot or container 61 by brackets 62 and 63 and has an output shaft 64. The brackets 62 and 63 are secured to the pot by a mounting plate 65 of known heat insulating material bolted to the pot. The plate 65 and a plate 66 bolted to the pot 61 form mounting portions of the rigid frame of the pump which includes end plates 67 and 68, longitudinal members 69 and 70 and plates 71 and 72. Pumping gears 73 and 74 are mounted rotatably on the plates 71 and 72. The shaft 64 drives the gear 73 through bevel gears 75 and 76, shaft 77, pinions 78 and 79 and shaft 80 pinned to the pump gear 73. The gear 73 meshes with the gear 74 to drive it in an inrunning direction such as to form the wave 12. The gear 73 is mounted rotatably on the plates 71 and 72 by the shaft 80 and arbor 81 journalled in the plates 71 and 72 are pinned to the gear 73. Arbors 82 and 83 pinned to the gear 74 are journalled in the plates 71 and 72. A plate 84 and a U-shaped bracket 85 are bolted to the plates 65 and 68 and journal the shaft 77. It should be noted that the pump 9 forms a unitary assembly removable from and insertable into the apparatus as a unit.

While the apparatus serves to form the wave 12 of solder free of dross extending completely across the printed circuit board 11, obviously, if it is desired to apply solder to only selected portions of the bottom of the board, annular band-like portions of the teeth of the gears may be removed to form a series of short meshing gears separated by the bands. This would form a series of separated short waves aligned with one another across the bath. Also, the cam 41 may have a series of spaced lobes rather than only one to space the solder applications along the board.

While the invention is thus described, it is not wished to be limited to the precise details described, as changes may be readily made without departing from the spirit of the invention.

What is claimed is:

1. In a dip-soldering apparatus, a soldering pot, a frame extending upwardly from the pot, a member pivoted on said frame for moving an article into contact with solder in the pot, motor means for moving the member in one direction after the member has been moved manually in the other direction, a pump for pumping solder to form a wave, a motor for driving the pump, switch means mounted on one of the frame and pivoted member for controlling the motor, and cam means mounted on the other of said frame and pivoted member and operable during a portion of the movement of the member in said one direction for actuating the switch means to energize the motor and cause a solder wave to be formed under an article mounted on said member, said switch means being arranged so as to be incapable of being actuated by the cam means when the member is moved in said other direction.

2. The dip soldering apparatus of claim 1 in which the pivoted member is a pendulum.

3. The dip soldering apparatus of claim 2 in which said pendulum member has an arcuate surface at the bottom end thereof adapted to engage an article to be soldered.

References Cited in the file of this patent

UNITED STATES PATENTS

| | | |
|---|---|---|
| 2,431,135 | Morse | Nov. 18, 1947 |
| 2,529,699 | Lach | Nov. 14, 1950 |
| 2,771,852 | Iles | Nov. 27, 1956 |
| 2,869,497 | Lehner | Jan. 20, 1959 |
| 2,870,532 | Young | Jan. 27, 1959 |
| 2,872,625 | Liebscher | Feb. 3, 1959 |
| 2,887,078 | Willis | May 19, 1959 |
| 2,962,801 | Cass | Dec. 6, 1960 |

FOREIGN PATENTS

| | | |
|---|---|---|
| 712,109 | Great Britain | July 21, 1954 |
| 780,556 | Great Britain | Aug. 7, 1957 |
| 798,701 | Great Britain | July 23, 1958 |